(12) United States Patent
Ayyapureddi

(10) Patent No.: US 11,562,784 B2
(45) Date of Patent: Jan. 24, 2023

(54) APPARATUSES, SYSTEMS, AND METHODS FOR VOLTAGE BASED RANDOM NUMBER GENERATION

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 311 days.

(21) Appl. No.: 16/994,408

(22) Filed: Aug. 14, 2020

(65) Prior Publication Data

US 2022/0051711 A1 Feb. 17, 2022

(51) Int. Cl.
*G11C 5/14* (2006.01)
*G06F 7/58* (2006.01)
*G11C 11/408* (2006.01)
*H03M 1/12* (2006.01)

(52) U.S. Cl.
CPC .............. *G11C 11/408* (2013.01); *G06F 7/58* (2013.01); *G11C 5/144* (2013.01); *H03M 1/12* (2013.01)

(58) Field of Classification Search
CPC ....... G11C 11/408; G11C 8/12; G11C 7/1006; G11C 5/14; G11C 7/222; G11C 11/4074; G11C 11/4076; G11C 7/16; G11C 11/406; G11C 11/4063; G06F 7/58; G06F 7/588; H03M 1/12
See application file for complete search history.

(56) References Cited

U.S. PATENT DOCUMENTS

| 2007/0070718 | A1* | 3/2007 | Luo ..................... G11C 5/147 365/189.09 |
| 2011/0022648 | A1* | 1/2011 | Harris ................... G11C 11/412 708/254 |
| 2018/0039484 | A1* | 2/2018 | La Fratta ............ G11C 11/4087 |

* cited by examiner

Primary Examiner — Jay W. Radke
(74) Attorney, Agent, or Firm — Dorsey & Whitney LLP

(57) ABSTRACT

Apparatuses, systems, and methods for voltage based random number generation. A memory may include a number of different voltages, which may be used to power various operations of the memory. During access operations to the memory, the voltage may vary, for example as word lines of the memory are accessed. The variability of the voltage may represent a source of randomness and unpredictability in the memory. A random number generator may provide a random number based on the voltage. For example, an analog to binary converter (ADC) may generate a binary number based on the voltage, and the random number may be based on the binary number.

20 Claims, 6 Drawing Sheets

APPARATUSES, SYSTEMS, AND METHODS FOR VOLTAGE BASED RANDOM NUMBER GENERATION

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. The memory may use random numbers for various applications. For example, it may be beneficial to perform certain operations with a degree of randomness to their timing, and random numbers may be useful for injecting that randomness. However, semiconductor memory devices may generally be deterministic devices, and it may difficult for them to generate random numbers.

DETAILED DESCRIPTION

Figure 1:
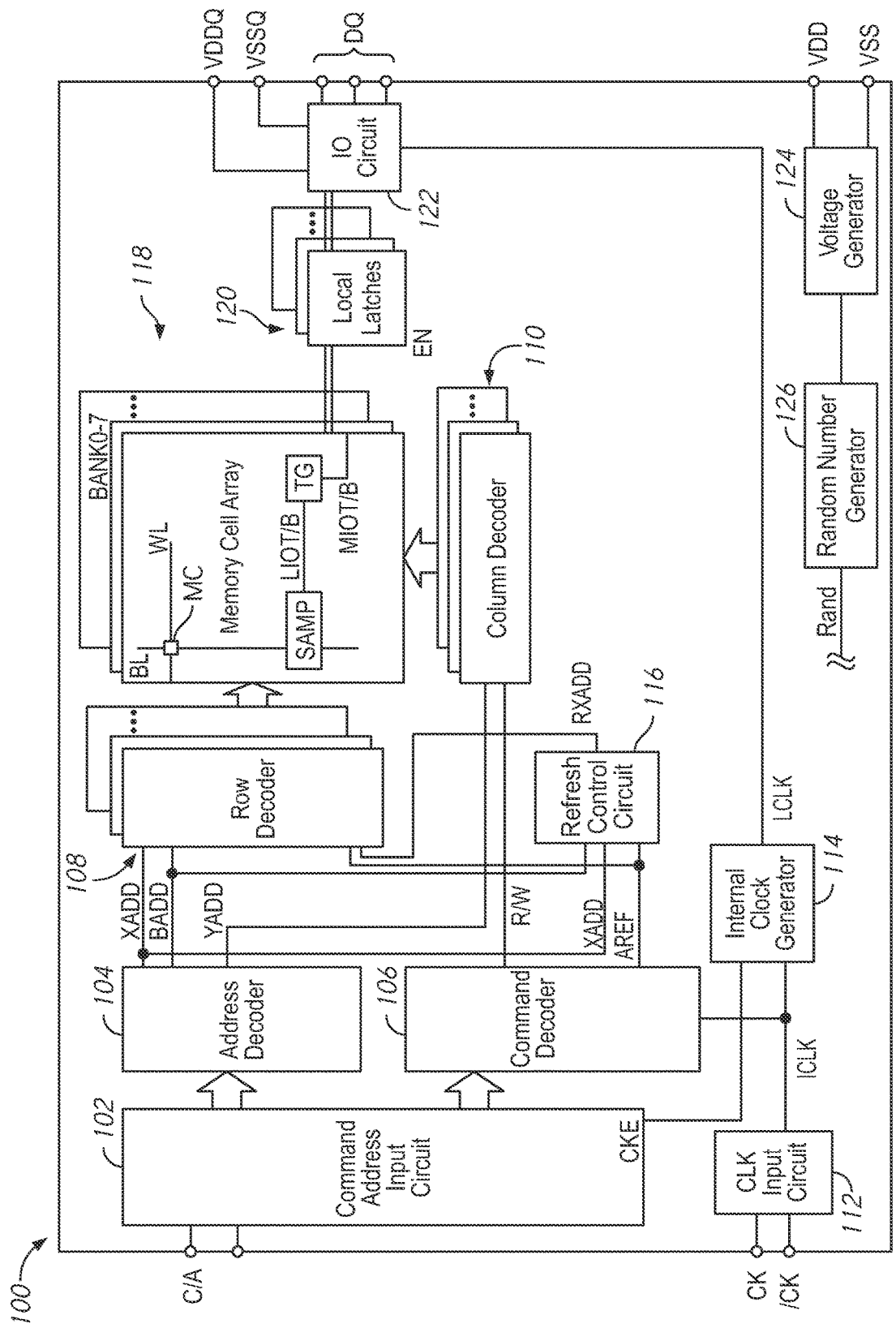
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A semiconductor device, such as a memory device, may generate one or more random numbers which may be used in various operations of the memory. For example, the memory may periodically sample addresses along an address bus in order to determine a number (and/or rate) of accesses to different addresses, for example to determine if one or more rows is being hammered. It may be beneficial for the sampling to occur with a degree of randomness. A random number may be used to inject the randomness into the timing of the sampling. Various methods may be used to generate random numbers, however memories (and semiconductor devices in general) may generally be deterministic. For example, a seed value may be generated, which may then be used to generate the random number. This deterministic behavior may reduce the 'randomness' of the random numbers, since it may be possible to determine which random number will be generated based on knowledge of how the deterministic process generates the random number. It also may reduce the inter-device randomness, since it may be possible to guess the random behavior of a device based on knowledge of the process of generating the random number of a different device of the same type. It may be useful to generate random numbers in a manner which is tied to physical qualities of the device, which may vary even between different devices of the same type.

The present disclosure is drawn to apparatuses, systems, and methods for voltage based random number generation. A memory device may use various voltages (e.g., represent, different logical levels of signals, to drive various operations, to power various components etc.). When the memory performs an operation, there may be a change in one or more of the voltages (e.g., a 'droop') caused by current pull as the operation begins. The exact value of this droop may be based, in part, on the physical structure of the die, which may vary between devices due to manufacturing variation. The droop may also be based on which operation is being performed. For example, if an access operation to the memory is being performed, which memory cells are being accessed may change the value of the droop.

The memory may include a random number generator which is coupled to one or more voltages of the memory. The random number generator may include an analog-to-digital converter (ADC) which may be coupled to the voltage. Responsive to various triggers (e.g., an access operation), the ADC may convert the voltage into a digital value. The digital value may be used directly as a random number, or may be used as a seed value for a sequence generator (e.g., a hash circuit, a linear feedback shift register) which creates a random number based on the seed value. In some embodiments, there may be a different random number generator for each bank of the memory. In some embodiments, bank level random numbers may be combined to generate an overall memory random number. In some embodiments, the random number based on voltage may be combined with a further source of randomness (e.g., fuse information, a different random number) to further increase the randomness of the random number. The use of a voltage-based random number may be advantageous because it may be difficult to control or predict the random number, and the circuitry to generate the random number (e.g., the ADC) may be a relatively small and simple circuit compared to other types of random number generator.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers over complementary local data lines (LIOT/B), transfer gate (TG), and complementary main data lines (MIOT/B) to the local latches 120. The data may then be provided to a serializer (not shown) and then the serialized data may be provided to the data terminals DQ through the I/O circuit 122. Conversely, write data is transferred from the DQ pads to the local latches 120 through a deserializer 121. From the local latches 120, the write data is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The memory device 100 may also include data strobe terminals DQS. The data strobe signal may be used to manage the timing of write operations to the memory device 100, while the system clock signal(s) CLK and /CLK may manage timing of other operations, such as read operations, refresh operations, and other operations.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and hank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that data is read out from memory cells (e.g., along the LIO and MIO) to the local latches 120. For example, the word line(s) and digit line(s) specified by the row and column addresses may be activated and data may be read out from the memory cells along the digit lines to the sense amplifiers. The data may be transferred to the read/write amplifier (RWAMP) 120, which may provide the read data to the IO circuit 122, which in turn may provide the read data to the data terminals DQ.

The device 100 may receive an access command which is a write command. When the write command is received, and a bank address, a row address and a column address are timely supplied with the write command, and write data is supplied through the DQ terminals to the read write amplifiers (RWAMP) 120. The write data provided to the RWAMP 120 is written to a memory cells in the memory array 118 corresponding to the row address and column address. For example, one or more word lines associated with the row address XADD may be activated by being coupled to a system voltage. The bit lines associated with the column address may be activated, and the write data may be provided along local I/O lines LIOT/B to the sense amplifiers and then along the activated bit lines to the memory cells at the intersection of the activated bit line and word line. The write data is then written to those memory cells.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

One or more of the voltages of the memory device 100 may be coupled as an input to a random number generator 126. The random number generator 126 may use the voltage(s) to generate a random number Rand. The random number Rand may be used by various other circuits of the memory. The random number generator 126 may be coupled to one or more voltages. In some embodiments, the random number generator 126 may receive a voltage from the voltage generator 124. In some embodiments, the random number generator 126 may be coupled to a voltage (e.g., VDD) which is provided from an external source to a voltage terminal of the memory. For consistency and brevity, the term VDD will be used to refer to the voltage which is coupled to the random number generator 126, however it should be understood that any voltage of the memory may be used as the input.

The random number generator 126 may produce a random number Rand which changes over time. For example, the value of the random number Rand may be based on the value of the voltage VDD, which may change as the memory performs various operations. In some embodiments, the random number generator 126 may constantly (e.g., as fast as possible) update the value of the random number Rand. In some embodiments, the random number generator 126 may periodically update the value of the random number Rand. In some embodiments, the random number generator 126 may be triggered by one or more internal signals of the memory (e.g., an access signal) to update the value of the random number Rand.

In some embodiments, there may be a single random number generator 126 which generates an overall random number Rand for the memory. In some embodiments, there may be multiple random number generators, each coupled to a different voltage of the memory. For example, the random number generator 126 may be repeated on a bank-by-bank basis. Each random number generator 126 may be coupled to a voltage associated with that bank, and may provide a random number based on that voltage. For example, each random number generator may be coupled to a bus which distributes a voltage (e.g., VDD) to that bank.

Figure 2:
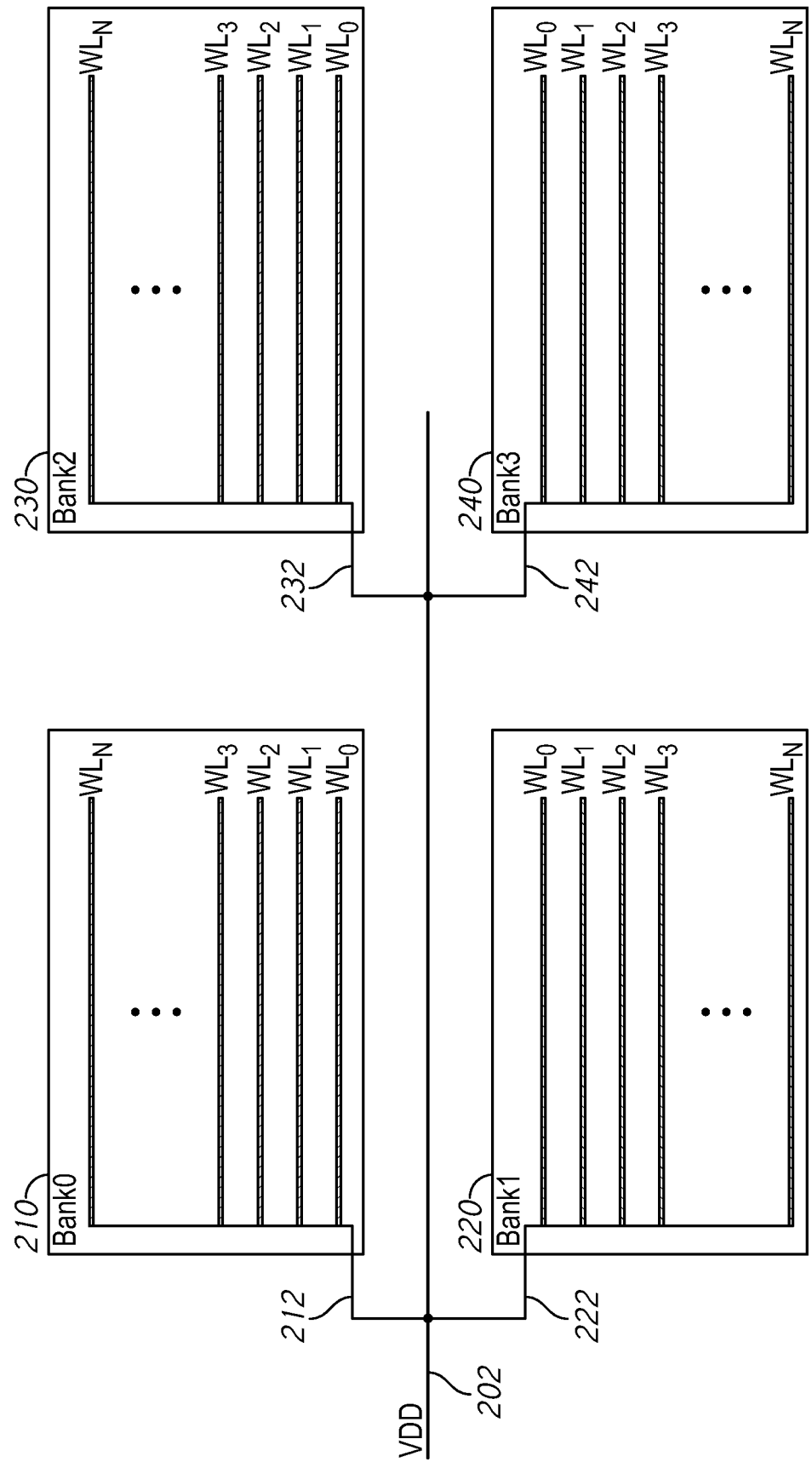
FIG. 2 is a block diagram of voltage distribution to different banks of a memory, according to some embodiments of the present disclosure.

FIG. 2 is a block diagram of voltage distribution to different banks of a memory, according to some embodiments of the present disclosure. FIG. 2 shows an example of how memory banks, such as those of the memory array 118 of FIG. 1, may be coupled to a system voltage such as VDD. It should be understood that FIG. 2 shows a simplified schematic layout for the sake of explanation and that the physical buses and memory dies of a memory may be laid out in a different fashion. Similarly, while only four memory banks are shown in FIG. 2, other numbers of memory banks (e.g., 8, 16, 32) may be used in other example embodiments. The system voltage VDD may represent any number of different voltages provided to and/or generated by the memory.

The voltage VDD is provided to the memory banks 210, 220, 230 and 240 along a voltage bus 202. The voltage bus 220 may be a conductive element within the memory which is carries the voltage VDD. Local buses 212, 222, 232, and 242 may couple the voltage VDD from the voltage bus 202 into the banks 210, 220, 230, and 240, respectively. The voltage carried by the local buses 212, 222, 232, and 242 may be used to power various operations within the bank 210, 220, 230, and 240, respectively. Since the banks and local buses may generally be similar, for the sake of brevity, only the first bank 210 and first local bus 212 will be described in detail.

The local bus 212 may be a conductive element which couples the voltage VDD from the voltage bus 202 into the memory bank 210. The bank 210 may include a number of memory cells arranged along a number of different word lines, here numbered $WL_0$ to $WL_N$. As part of an access operation, the word line may activated by being coupled to the local bus 212. A number of switches (not shown) may control whether the word line is coupled to the local bus 212 or not, and the switches may be controlled by a row controller (e.g., 108 of FIG. 1) responsive to a row address.

When a row is activated, it may represent a relatively large current draw, as the word line may need to be charged up to the voltage VDD. Accordingly, when a word line is activated, there may be a change or 'droop' in the voltage along the local bus 212 and also the voltage bus 202. For example, in the moments after a word line is activated the current pull from activating the word line may cause the voltage to drop on the local bus 212 and voltage bus 202. The voltage may then return to VDD as various drivers restore the buses to VDD. Further, the amount of the droop in the voltage as well as the duration of the droop may be dependent on which word line is activated. For example, as laid out in FIG. 2, the word line WL0 may be closer to the voltage bus 202 than the word line WLN. Accordingly, there may be a different resistance along the local bus 212 between the voltage bus 202 and the word line WL0 and between the voltage bus 202 and the word line WLN. In a similar fashion, the same word line in different banks (e.g., WL1 in bank 210 and WL1 in bank 230) may lead to different amounts and durations of droop in the voltage of the voltage bus 202.

As different word lines in different banks are accessed over time, the voltage on the voltage bus 202 may vary. Since the amount and duration of the variation may be dependent on the word lines which are accessed, the voltage of the voltage bus 202 may vary in a manner which is difficult to determine. Further, manufacturing tolerances may mean that even if two different memory chips have the same pattern of accesses performed on them, the voltage droops in their respective voltage buses may be different. Accordingly, the voltage along the voltage bus may include an element of randomness and unpredictability which may be useful for generating random numbers.

Figure 3:
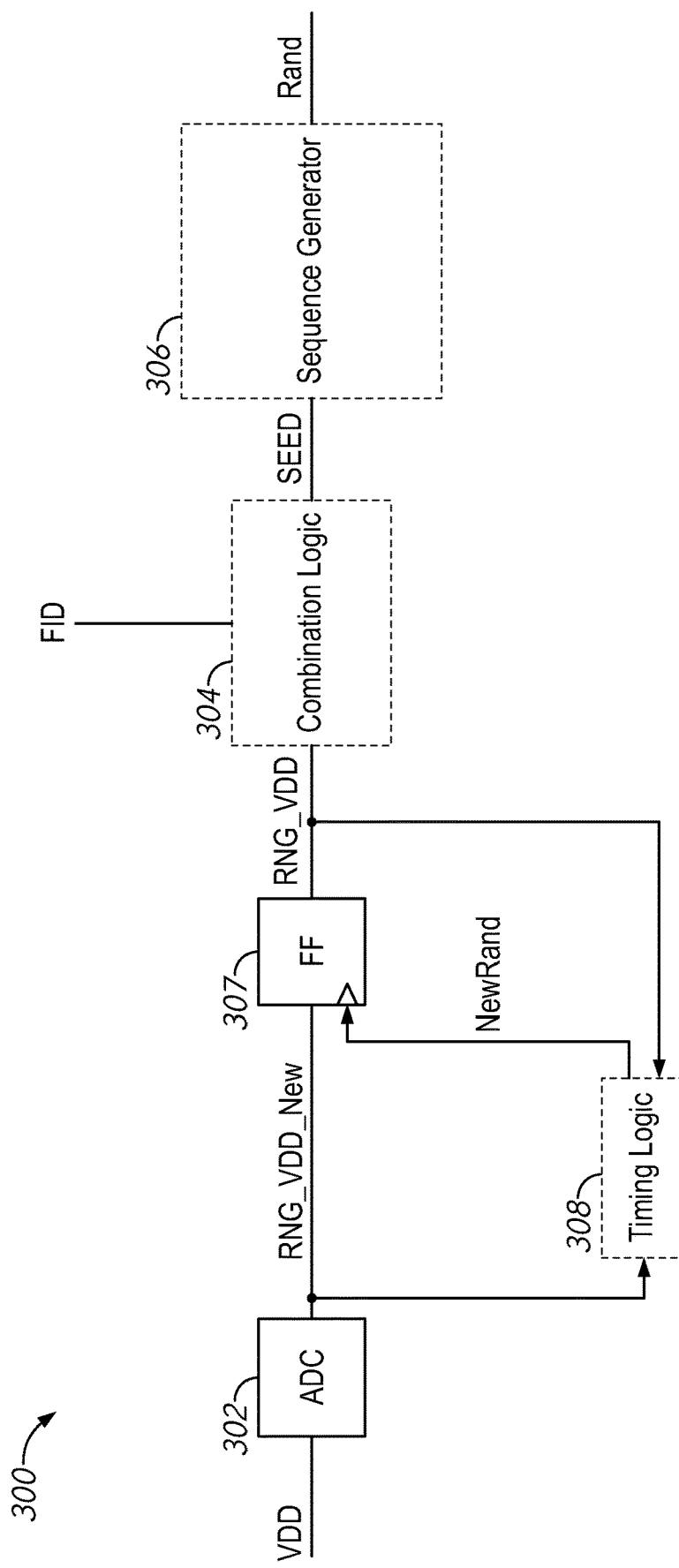
FIG. 3 is a block diagram of a random number generator according to some embodiments of the present disclosure.

FIG. 3 is a block diagram of a random number generator according to some embodiments of the present disclosure. The random number generator 300 may, in some embodiments, be included in the random number generator 126 of FIG. 1 in some embodiments. The random number generator 300 receives a voltage VDD, and provides a random number Rand based on the voltage VDD. In some embodiments, optional components such as the combination logic 304, sequence generator 306, and/or timing logic 308 to further increase the randomness of the random number Rand and/or increase the complexity of the relationship between the voltage VDD and the random number Rand. The value RNG_VDD may be stored in a latch 307, and may be used as the random number Rand until the random number generator 300 may generate a new value of the random number (e.g., RNG_VDD_New) and store it in the latch 307.

Various optional components of the random number generator 300 are shown in dotted lines. Any combination of these optional components may be used in the random number generator 300.

The random number generator 300 includes an analog-to-digital converter (ADC) 302. The ADC 302 may convert the analog value of the voltage VDD to a digital number RNG_VDD_New. The value RNG_VDD_New may be saved in the latch 307 as the value RNG_VDD. As discussed in more detail herein, various methods may be used to determine when to activate a timing signal NewRand, which may cause the latch 307 to capture the current value of RNG_VDD_New as the new value of RNG_VDD. Due to fluctuations of the voltage VDD, the digital value RNG_VDD may be a random number. In some embodiments, the ADC 302 may focus on a particular range of values for the voltage VDD based on the expected, fluctuations of the values of VDD. For example, a maximum value of RNG_VDD may be associated with the value VDD at its full specified value, and the minimum value of RNG_VDD being associated with the expected lowest value of VDD during a droop. The digital value RNG_VDD may be a N-bit binary number. For example, in some embodiments, the digital value RNG_VDD may be a 6-bit binary number. Other numbers of bits (e.g., 4, 8, 10, etc.) may be used in other example embodiments.

In some embodiments, the ADC 302 may be chosen so that it has relatively low precision when converting the analog voltage VDD to the digital value RNG_VDD. For example, the ADC 302 may have large tolerances such that a given value of VDD may lead to a first value RNG_VDD at a first time and a second value of RNG_VDD at a second time. This may decrease the predictability of the random number generator 300, which may increase the randomness of the digital value RNG_VDD.

In some embodiments, the digital value RNG_VDD may be used directly as the random number Rand (e.g., the combination logic 304 and sequence generator 306 may be omitted). In some embodiments, the digital value RNG_VDD may be modified to generate the random number Rand, which may further increase the randomness and/or unpredictability of the random number Rand.

In some embodiments, combination logic 304 may be used to combine the digital value RNG_VDD with another number. For example, a unique identifier value of the memory, such as the fuse ID (FID) may be used. The combination logic 304 may combine the digital value RNG_VDD with the FID to generate a value SEED. For examples, the combination logic 304 may use one or more XOR logic gates to combine the bits of the FID with the bits of the digital value RNG_VDD to generate the value of SEED. In some embodiments, the value SEED may be used as the random number Rand (e.g., the sequence generator 306 may be omitted).

In some embodiments, a sequence generator 306 may be used to generate a random number Rand based on the value of SEED. For example, the sequence generator 306 may include a linear feedback shift register (LFSR), which may generate a number based on an input seed value (e.g., the value SEED). An example sequence generator 306 may include a hash circuit, which may map an N-bit value of SEED onto a M-bit value of the random number Rand. In some embodiments, the combination logic 304 may be omitted, and the value RNG_VDD may be used directly as a seed value for the sequence generator 306.

In some embodiments, the random number generator 300 may constantly (e.g., as fast as the circuit can operate) update the value of the random number Rand. In some embodiments, the random number generator 300 may omit the latch 307, and the value RNG_VDD may be directly provided by the ADC 302 as the random number Rand.

In some embodiments the sequence generator 300 may include a timing logic circuit 308 which may control when new values of the random number Rand are provided. For example, the timing logic 308 may provide an activation signal NewRand which is coupled to a clock terminal of the latch 307. When the timing logic provides the signal NewRand at an active level, a current output of the ADC RNG_VDD_New may be captured in the latch 307 and provided as the value RNG_VDD (e.g., overwriting a previous value of RNG_VDD).

The timing logic 308 may, in some example embodiments, compare the previous value of the random number (e.g., RNG_VDD) to a current value of the random number (e.g., RNG_VDD to determine when to update the value of the random number (e.g., when to provide the signal NewRand at an active level). For example, the timing logic 308 may periodically compare the current random number RNG_VDD_New the stored random number RNG_VDD. IF the values are different, the timing logic 308 may update a counter. When the counter reaches a threshold value (e.g., 3, 6, 9, etc.), the signal NewRand may be provided at an active level and the counter may be reset.

In some embodiments, the timing logic 308 may use other methods (alternatively or additionally) to determine when to provide the signal NewRand at an active level. For example, the timing logic 308 may be coupled to clock signals (or may include an oscillator and generate its own clock signal) and may periodically provide the signal New Rand. Example, timing logic 308 may be coupled to signals of the memory (e.g., word line activation signals) and may provide the signal NewRand responsive to those signals. Other methods of controlling the timing may be used in other embodiments.

Figure 4:
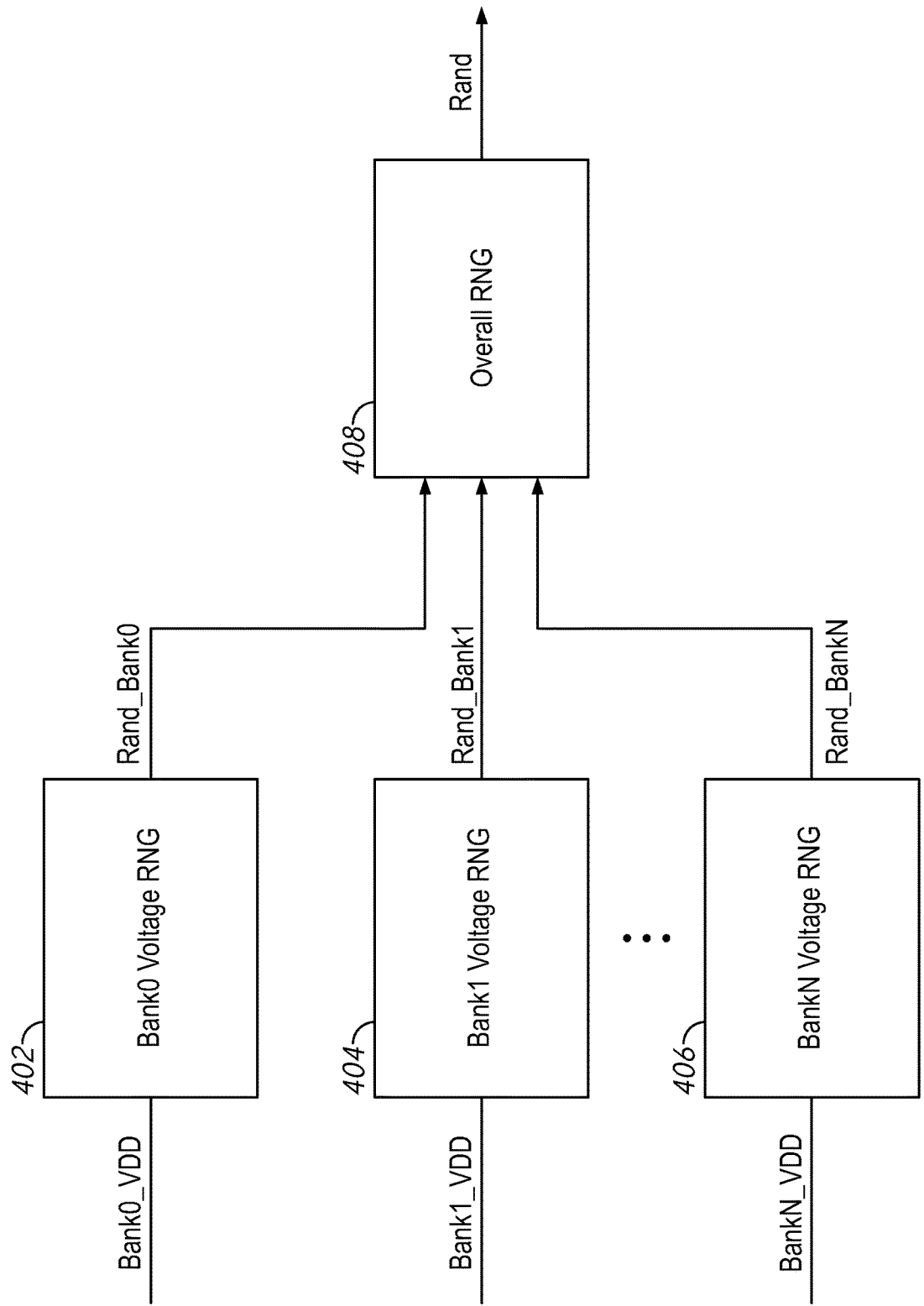
FIG. 4 is a block diagram of different organizations of random number generators according to some embodiments of the present disclosure.

FIG. 4 is a block diagram of different organizations of random number generators according to some embodiments of the present disclosure. FIG. 4 shows a number of random number generators, each of which may include one or more of the features and components discussed with respect to the random number generator 300 of FIG. 3.

Each of the random number generators 402, 404, and 406 may be associated with a different bank of the memory. For example, the first random number generator 402 may be associated with a first bank (e.g., 210 of FIG. 2), the second random number generator 404 may be associated with a second bank (e.g., 220 of FIG. 2), etc. Each of the random number generators 402-406 may be coupled to a voltage associated with that bank. For example, the first random number generator 402 may be coupled to a first voltage Bank0_VDD. The first voltage Bank0_VDD may represent a voltage along a local voltage bus (e.g., 212 of FIG. 2).

Accordingly, each of the random number generators 402-406 may provide a random number Rand_Bank0 to Rand_BankN respectively, which is associated with a respective bank. Each bank level random number may be used by bank specific circuits. For example, the a first bank random number Rand_Bank0 may be used to inject randomness into the operation of a refresh control circuit (e.g., 116 of FIG. 1).

In some embodiments, one or more of the bank level random numbers Rand_Bank0 to Rand_BankN may be combined to generate an overall random number Rand. The memory may include an optional overall random number generator 408 which may combine the bank level random numbers into an overall random number Rand. In some embodiments, the overall random number generator 408 may combine the random numbers, for example with one or more NOR gates. In some embodiments the overall random number generator 408 may include further sources of randomness (e.g., an LFSR) and may use the combined bank level random numbers as a seed.

In some embodiments, different ones of the bank level random number generators 402 to 406 may be active at different times. For example, the random number generators 402 and 404 may be active (e.g., providing values of Rand_Bank0 and Rank_Bank1 respectively) while the bank level RNG 406 is inactive (e.g., the signal Rand_BankN is not provided). In some embodiments, the random number generators 402-406 may be activated based on which banks are active (e.g., the bank address BADD).

In some embodiments, banks may be grouped together into bank groups, and the bank groups may be used to determine when to update the random numbers associated with the banks. For example, when any of the banks in a bank group receives an access command (e.g., as indicated by a bank address BADD) then all of the random number generators associated with banks of that bank group may update their random numbers.

Figure 5:
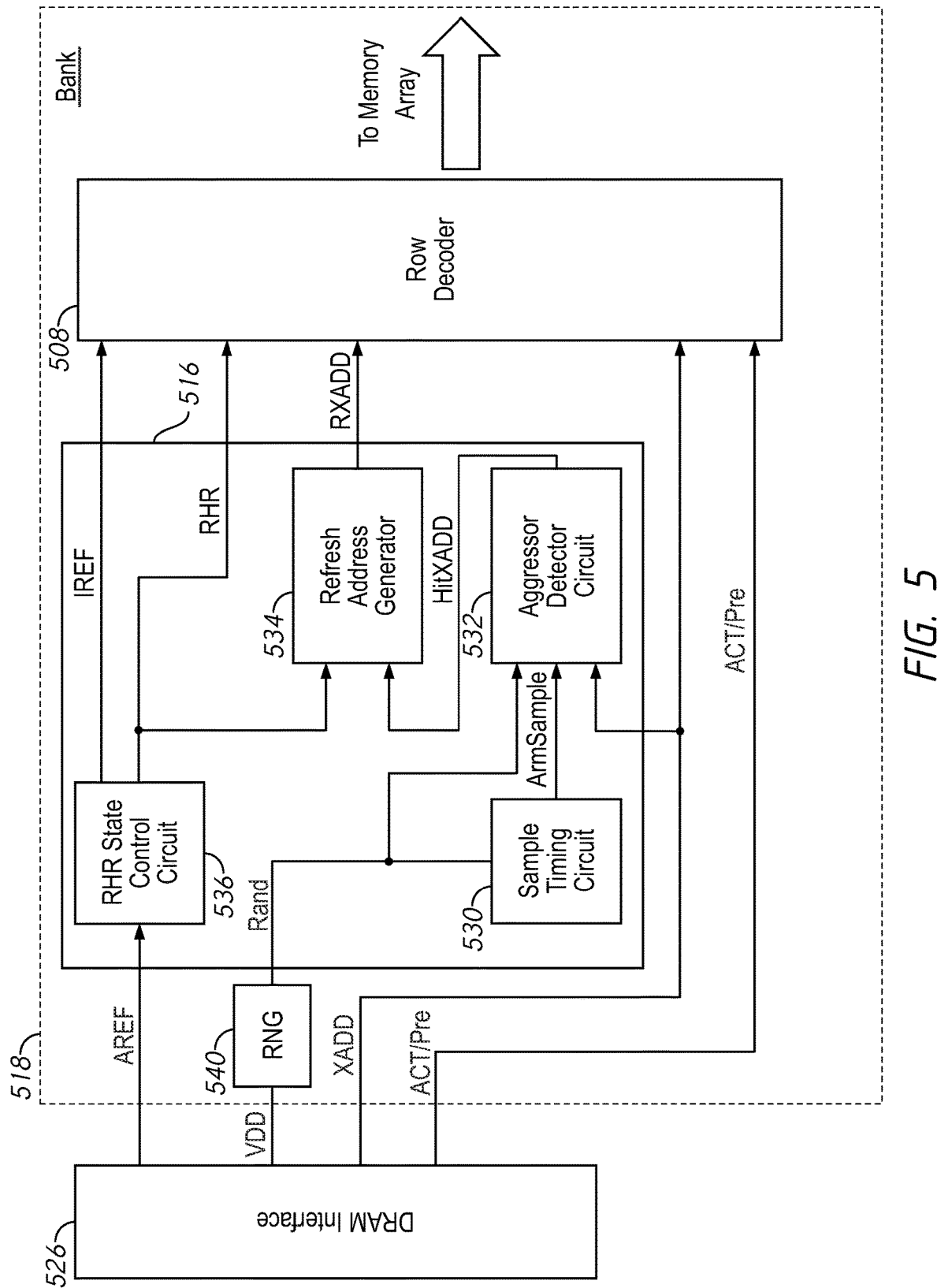
FIG. 5 is a block diagram of a refresh control circuit according to an embodiment of the present disclosure.

FIG. 5 is a block diagram of a refresh control circuit according to an embodiment of the present disclosure. The refresh control circuit 516 may, in some embodiments, be included in the refresh control circuit 116 of FIG. 1. Certain internal components and signals of the refresh control circuit 516 are shown to illustrate the operation of the refresh control circuit 516. The dotted line 518 is shown to represent that in certain embodiments, each of the components (e.g., the refresh control circuit 516 and row decoder 508) may correspond to a particular bank of memory, and that these components may be repeated for each of the banks of memory. Thus, there may be multiple refresh control circuits 516, random number generators 540, and row decoders 508. For the sake of brevity, only components for a single bank will be described.

A DRAM interface 526 may provide one or more signals to an address refresh control circuit 516 and row decoder 508. The refresh control circuit 516 may include a sample timing circuit 530, an aggressor detector circuit 232, a row hammer refresh (RHR) state control circuit 536 and a refresh address generator 534. The DRAM interface 526 may provide one or more control signals, such as a refresh signal AREF, activation and pre-charge signals ACT/Pre, and a row address XADD. The refresh control circuit 516 provides refresh address RXADD with timing based on the refresh signal AREF when the bank associated with the refresh control circuit 516 is in the refresh mode.

The DRAM interface 526 may also provide a voltage VDD to a random number generator 540, which in turn may provide a random number Rand based on the voltage VDD. The random number generator 540 may be bank level circuit (e.g., repeated for each bank) or may be an overall random number generator which provides a single random number Rand to each refresh control circuit 516 of the memory. In some embodiments, the random number generator 540 may be included in the random number generator 126 of FIG. 1, 300 of FIG. 3, and/or 402-408 of FIG. 4. The random number Rand may be used by one or more components of the refresh control circuit 516.

A particular configuration is shown in the example embodiment of FIG. 5, where the random number Rand is used by the sample timing circuit 530 and the aggressor detector circuit 532. However, in other embodiments, the random number Rand may be used by one or the other of the sample timing circuit 530 and the aggressor detector circuit 532. In some embodiments, a first random number may be used by the sample timing circuit 530 and a second random number may be used for the aggressor detector circuit 532. In some embodiments, other components of the refresh control circuit 516 may use the random number Rand.

The aggressor detector circuit 532 may sample the current row address XADD responsive to an activation of a sampling signal ArmSample provided by the sample timing circuit 530. The aggressor detector circuit 532 may be coupled to all of the row addresses XADD sent along the row address bus, but may only receive (e.g., process, pay attention to) the current value of the row address XADD when there is an activation of the sampling signal ArmSample. In other example embodiments sampling may not be used.

The received row addresses (either the sampled addresses or all addresses) may be stored in the aggressor circuit 532 and/or compared to previously stored addresses. The aggressor detector circuit 532 may provide a match address HitXADD based on a current row address XADD and/or previously stored row addresses. The RHR state control circuit 536 may provide the signal RHR to indicate that a row hammer refresh (e.g., a refresh of the victim rows corresponding to an identified aggressor row) should occur. The RHR state control circuit 536 may also provide an internal refresh signal IREF, to indicate that an auto-refresh should occur.

Responsive to an activation of RHR or IREF, the refresh address generator 534 may provide a refresh address RXADD, which may be an auto-refresh address or may be one or more victim addresses corresponding to victim rows of the aggressor row corresponding to the match address HitXADD. The RHR state control circuit 536 may provide a set of activations of RHR and IREF responsive to the refresh signal AREF. The row decoder 508 may perform a refresh operation responsive to the refresh address RXADD and the row hammer refresh signal RHR. The row decoder 508 may perform an auto-refresh operation based on the refresh address RXADD and the internal refresh signal IREF.

The DRAM interface 526 may represent one Of more components which provides signals to components of the bank. In some embodiments, the DRAM interface 526 may represent a memory controller coupled to the semiconductor memory device (e.g., device 100 of FIG. 1). In some embodiments, the DRAM interface 526 may represent components such as the command address input circuit 102, the address decoder 104, and/or the command decoder 106 of FIG. 1. The DRAM interface 526 may provide a row address XADD, the refresh signal AREF, a voltage VDD, and access signals such as an activation signal ACT and a pre-charge signal Pre. Although not shown in FIG. 2, the DRAM interface 526 may also provide a bank address BADD, which may indicate which bank the accessed row address XADD is located in. The bank address BADD may activate a particular refresh control circuit 516 associated with the bank indicated by the bank address BADD. The DRAM interface may also put the refresh control circuit into a refresh mode by providing activations of the refresh signal AREF. The refresh signal AREF may be a periodic signal provided during a refresh mode which may indicate a timing for refresh operations. The access signals ACT and Pre may generally be provided as part of an access operation along with a row address XADD. The activation signal ACT may be provided to activate a given bank of the memory. The pre-charge signal Pre may be provided to pre-charge the given bank of the memory. The row address XADD may be a signal including multiple bits (which may be transmitted in series or in parallel) and may correspond to a specific row of an activated memory bank.

In the example embodiment of FIG. 2, the refresh control circuit 516 uses sampling to monitor a portion of the row addresses XADD provided along the row address bus. Accordingly, instead of responding to every row address, the refresh control circuit 516 may sample the current value of the row address XADD on the row address bus, and may determine which addresses are aggressors based on the sampled row addresses. The timing of sampling by the refresh control circuit 516 may be controlled by the sample timing circuit 530 which provides the sampling signal ArmSample. The sample timing circuit 530 may provide activations of the sampling signal ArmSample, and each activation of the signal ArmSample may indicate that a current value of the row address should be sampled. An activation of ArmSample may be a 'pulse', where ArmSample is raised to a high logic level and then returns to a low logic level.

The activations of the signal ArmSample may be provided with periodic timing, random timing, semi-random timing, pseudo-random timing, or combinations thereof. The timing at which the sample timing circuit 530 provides the signal ArmSample may be based on the random number Rand. For example, an oscillator may increment a counter, and when the counter matches a value of the random number Rand, the signal ArmSample may be provided. After providing the signal ArmSample, the sample timing circuit 530 may trigger the RING 540 to provide a new value of the random number Rand. In other embodiments, sampling may not be used, and the aggressor detector circuit 532 may receive every value of the row address XADD along the row address bus. In such embodiments, the sample timing circuit 530 and the sampling signal ArmSample may be omitted.

The aggressor detector circuit 532 may receive the row address XADD from the DRAM interface 526 and the signal ArmSample from the sample timing circuit 530. The row address XADD on the row address bus may change as the DRAM interface 526 directs access operations (e.g., read and write operations) to different rows of the memory cell array (e.g., memory cell array 118 of FIG. 1). Each time the aggressor detector circuit 532 receives an activation (e.g., a pulse) of the signal Arm ample, the aggressor detector circuit 532 may sample the current value of XADD.

The aggressor detector circuit 532 may determine aggressor addresses based on one or more of the sampled row addresses, and then may provide the determined aggressor address as the match address HitXADD. The aggressor detector circuit 532 may include a data storage unit (e.g., a number of registers), which may be used to store sampled row addresses. In some example embodiments, when the aggressor detector circuit 532 samples a new value of the row address XADD (e.g., responsive to an activation of ArmSample) it may compare the sampled row address to the addresses stored in the data storage unit. If there is a match between the sampled address and one of the stored addresses, the aggressor detector circuit 532 may provide a match signal Match. In some example embodiments, the match address HitXADD may be one of the addresses stored in the aggressor detector circuit 532 which has been matched by the sampled address XADD the most frequently. For example, the aggressor detector circuit 532 may count a number of times that each address XADD is received, and provide the address which has been received the most times as the match address HitXADD.

In some embodiments, the aggressor detector circuit 532 may count a number of times that addresses are received, and mark the address as the match address HitXADD when its count exceeds a threshold. In some embodiments, the threshold may be varied based on the random number Rand. In some embodiments, the count values may be varied based on the random number Rand.

The memory device may carry out a sequence of refresh operations in order to periodically refresh the rows of the memory device as part of a refresh mode. The RHR state control circuit 536 may determine if a given refresh operation is an auto-refresh operation or a targeted refresh operation. The RHR signal may be generated in order to indicate that the device should refresh a particular targeted row (e.g., a victim row) instead of an address from the sequence of auto-refresh addresses. The RHR state control circuit 536 may also provide an internal refresh signal IREF, which may indicate that an auto-refresh operation should take place. In some embodiments, the signals RHR and IREF may be generated such that they are not active at the same time (e.g., are not both at a high logic level at the same time). In some embodiments, IREF may be activated for every refresh operation, and an auto-refresh operation may be performed unless RHR is also active, in which case a targeted refresh operation is performed instead. The RHR state control circuit may perform a sequence of auto-refresh operations and targeted refresh operation responsive to one or more activations of the refresh signal AREF.

In some embodiments, the refresh control circuit 516 may perform multiple refresh operations responsive to each activation of the refresh signal AREF. For example, each time the refresh signal AREF is received, the refresh control circuit 516 may perform K different refresh operations, by providing K different refresh addresses RXADD. Each refresh operation may be referred to as a 'pump'. Each of the K different refresh operations may be an auto-refresh operation or a targeted refresh operation. In some embodiments, the number of targeted and auto-refresh operations may be constant in each group of pumps responsive to an activation of the refresh signal AREF. In some embodiments it may vary.

The refresh address generator 534 may receive the row hammer refresh signal MIR and the match address HitXADD. The match address HitXADD may represent an aggressor row. The refresh address generator 534 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed.

The refresh address generator 534 may determine the value of the refresh address RXADD based on the row hammer refresh signal RHR. In some embodiments, when the signal RHR is not active, the refresh address generator 534 may provide one of a sequence of auto refresh addresses. When the signal RHR is active, the refresh address generator 534 may provide a targeted refresh address, such as a victim address, as the refresh address RXADD. In some embodiments, the refresh address generator 534 may count activations of the signal RHR, and may provide closer victim rows (e.g., HitXADD+/−1) more frequently than victim rows which are further away from the aggressor address (e.g., HitXADD+/−2).

The row decoder 508 may perform one or more operations on the memory array not shown) based on the received signals and addresses. For example, responsive to the activation signal ACT and the row address XADD (and IREF and RHR being at a low logic level), the row decoder 508 may direct one or more access operations (for example, a read operation) on the specified row address XADD. Responsive to the IREF and/or RHR signal being active, the row decoder 508 may refresh the refresh address RXADD.

Figure 6:
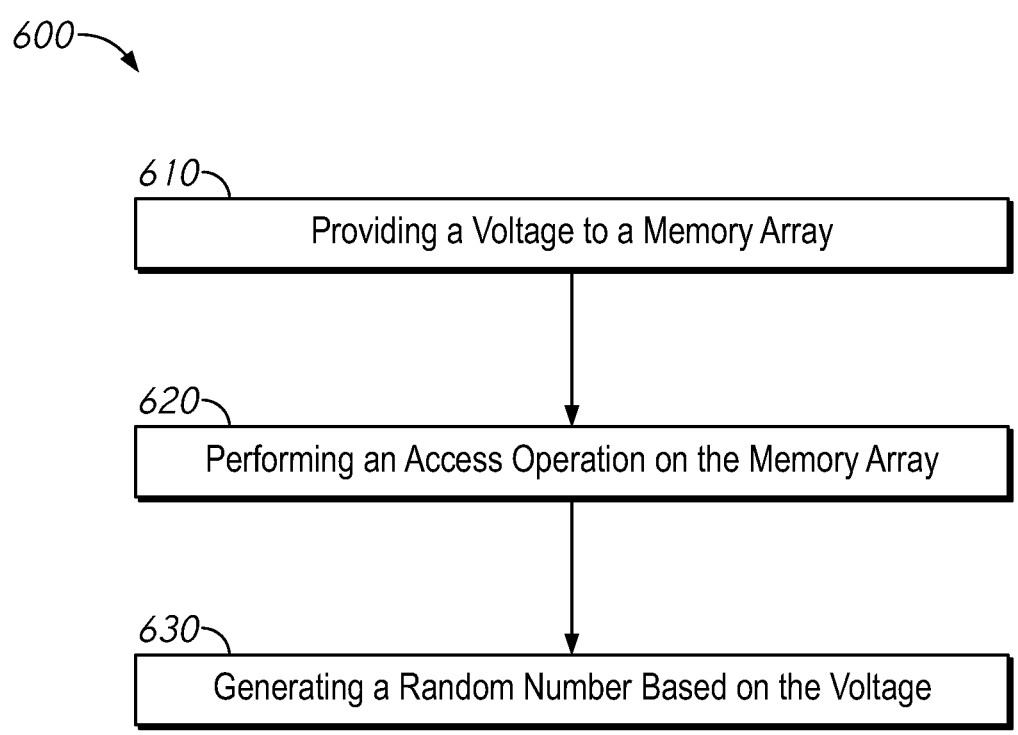
FIG. 6 is a block diagram of a method of generating random numbers based on voltages of a memory according to some embodiments of the present disclosure.

FIG. 6 is a block diagram of a method of generating random numbers based on voltages of a memory according to some embodiments of the present disclosure. The method 600 may, in some embodiments, be performed by one or more of the apparatuses and components represented in FIGS. 1-5.

The method 600 may generally begin with box 610, which describes providing a voltage to a memory array. The memory array may receive a system voltage (e.g., VDD) which may be used to power various operations of the memory. The voltage may be distributed along a voltage bus (e.g., 202 of FIG. 2). The voltage may be distributed along various bank level buses (e.g., 212, 222, 232, and 242 of FIG. 2) to banks of the memory. In some embodiments, the voltage along the bank level bus may be used as the voltage.

Box 610 may generally be followed by box 620, which describes performing an access operation on the memory array. Performing the access operation may change the voltage. For example, the access operation may involve activating a word line by coupling one or more word lines of the memory array to the voltage. This may represent a relatively large voltage draw, which may cause a droop in the voltage. The value and duration of the droop may be based, in part, on which word lines of the memory are activated as part of the access operation.

Box 620 may generally be followed by box 630 which describes generating a random number based on the voltage. Since the voltage may vary over time (e.g., with various access operations) the random number may have relatively high randomness and/or unpredictability. Generating the random number may include using an analog to digital converter (ADC) to generate a binary number based on the voltage. In some embodiments, the binary number may be combined with an additional value (e.g., a fuse identification number) to generate a combined value, and the random number may be based on the combined value. In some embodiments, the binary number may be used as a seed by a sequence generator to generate the random number. In some embodiments, the binary number may be used as the random number.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a memory array comprising a plurality of memory cells arranged along word lines, wherein the memory array is configured to access memory cells along selected ones of the plurality of word lines as part of an access operation;
   a power supply voltage coupled to the memory array, wherein a value of the power supply voltage changes to a changed value as part of the access operation; and
   a random number generator configured to generate a random number based on the changed value.

2. The apparatus of claim 1, wherein the random number generator includes an analog to digital converter (ADC) configured to generate a binary number based on the changed value of the power supply voltage, and wherein the random number is based on the binary number.

3. The apparatus of claim 2, wherein the random number generator further comprises a sequence generator configured to use the binary number as a seed to generate the random number.

4. The apparatus of claim 2, wherein the random number generator further comprises a combination logic circuit configured to generate a seed value based on the binary number and an additional number, wherein the random number is based on the seed value.

5. The apparatus of claim 4, wherein the additional number is a fuse identification number.

6. The apparatus of claim 1, wherein the random number generator comprises timing logic configured to control when a new value of the random number is generated.

7. The apparatus of claim 1, further comprising a refresh control circuit configured to sample row addresses off a row address bus responsive to a sampling signal, and configured to refresh at least one of the plurality of word lines based, in part, on the sampled row addresses, wherein the sampling signal is provided with timing based on the random number.

8. The apparatus of claim 1, wherein the voltage is a voltage of a bank voltage bus associated with one of a plurality of banks of the memory array.

9. An apparatus comprising:
a plurality of memory banks:
a plurality of power supply voltages, each changing in value to a respective changed value as part of an access to a respective associated memory bank associated with one of the plurality of memory banks; and
a plurality of random number generators, each configured to generate a respective random number based on a respective one of the respective changed values.

10. The apparatus of claim 9, further comprising, an overall random number generator configured to generate an overall random number based on at least two of the random numbers generated by at least two of the plurality of random number generators.

11. The apparatus of claim 9, wherein a portion of the plurality of random number generators are active while a remainder of the plurality of random number generators are inactive.

12. The apparatus of claim 9, wherein each of the plurality of random number generators comprises an analog to digital converter configured to generate a binary number based on a value of the associated one of the plurality of voltages.

13. The apparatus of claim 12, wherein each of the plurality of random number generators further comprises a sequence generator configured to use the binary number as a seed to generate the respective random number.

14. The apparatus of claim 12, wherein each of the plurality of random number generators further comprises a combination logic circuit, and wherein the respective random number is based, in part, on the binary number and an additional value.

15. A method comprising:
providing a first power supply voltage to a memory array:
performing an access operation on the memory array, wherein the access operation changes a value of the first power supply voltage to a first changed value: and
generating a random number based on the first changed value.

16. The method of claim 15, further comprising generating a binary number based on the first changed value with an analog to digital converter (ADC), wherein the random number is based on the binary number.

17. The method of claim 16, further comprising combining the binary number with an additional value to generate a combined value, wherein the random number is based on the combined value.

18. The method of claim 16, further comprising generating the random number by using the binary number as a seed of a sequence generator circuit.

19. The method of claim 15, further comprising:
generating a first random number based on the first changed value, wherein the first power supply voltage is associated with a first bank of the memory array;
generating a second random number based on a second changed value of a second power supply voltage associated with a second bank of the memory array: and
generating the random number based on the first random number and the second random number.

20. The method of claim 15, further comprising sampling row addresses along a row address bus with timing based on the random number.

* * * * *